United States Patent [19]

Goodspeed

[11] 4,287,433
[45] Sep. 1, 1981

[54] TRANSISTOR LOGIC TRISTATE OUTPUT WITH REDUCED POWER DISSIPATION

[75] Inventor: Steven N. Goodspeed, South Portland, Me.

[73] Assignee: Fairchild Camera & Instrument Corp., Mountain View, Calif.

[21] Appl. No.: 5,929

[22] Filed: Jan. 24, 1979

[51] Int. Cl.³ .................. H03K 19/084; H03K 19/088
[52] U.S. Cl. ................................. 307/473; 307/456
[58] Field of Search ............... 307/209, 213, 214, 215, 307/218

[56] References Cited

U.S. PATENT DOCUMENTS 4,194,132  3/1980  Mrazek ............................... 307/209

OTHER PUBLICATIONS

Military Specification Microcircuits Mil-M-38510/3-09A, (USAF), pp. 44-71, Jan. 4, 1978.
Low Power Schottky Data Book, "Circuit Characteristics", pp. 2-3 thru 2-7, Copyright, 1977, Fairchild Camera and Instrument Corp.

Primary Examiner—John Zazworsky
Attorney, Agent, or Firm—Paul J. Winters; Ronald J. Meetin

[57] ABSTRACT

A transistor logic tristate output device with plural phase splitter transistor means coupled in parallel configuration jointly to control sinking of current by the pulldown element with only one of the plural phase splitter transistor means coupled to control sourcing of current by the pullup element. In a preferred embodiment dual phase splitter transistors define a relatively low resistance path from high potential for controlling the pulldown element and a relatively high resistance path from high potential through the enable gate restricting power consumption in the high impedance third state.

12 Claims, 2 Drawing Figures

TRANSISTOR LOGIC TRISTATE OUTPUT WITH REDUCED POWER DISSIPATION

FIELD OF THE INVENTION

This invention relates to a new and improved tristate output gate for transistor logic circuits affording reduced power consumption in the high impedance third state and particularly suitable for integrated circuits and applications in which a plurality of logic circuits or gates are coupled at their outputs to a common bus.

BACKGROUND OF THE INVENTION AND PRIOR ART STATEMENT

In conventional transistor-transistor logic (TTL) and diode-transistor logic (DTL), logical values corresponding to binary "1" and "0" are ordinarily represented by a high level voltage $V_{oH}$, for example greater than 2.5 volts and a low level voltage $V_{oL}$, for example less than 0.8 volts. In positive logic, the high level binary "1" is derived from a voltage source $V_{cc}$ which sources current to the output when a binary "1" is to be delivered by the logic gate. When a binary "0" is required at the output, the logic gate "sinks" the current from the output load to a low level so that the low level voltage $V_{oL}$, appears at the output of the logic gate. Thus, the typical TTL logic gate functions by "sourcing" and "sinking" current at the output according to whether a binary "1" (high level voltage) or a binary "0" (low level voltage) is the desired outcome of previously executed logical operations. In negative logic the representation of binary 1 and 0 by high and low level voltage is reversed.

A conventional TTL tristate output device is illustrated in FIG. 1. Several elements or stages can be identified in such a TTL output gate. The "pullup" 11 for sourcing current from the higher level voltage $V_{cc}$ corresponding to binary 1 consists of transistors Q3 and Q4 forming a Darlington transistor that can supply current between the high level voltage source $V_{cc}$ and the output $V_{out}$. The "pulldown" element or stage 12 for sinking current and voltage from the output to ground consists of transistor Q2 with conventional squaring network transistor Q5 at its base. The phase splitter element or stage 13 consists of transistor Q1 which receives the data signal input to the gate in the form of a high or low level voltage at $V_{in}$ and controls the pullup and pulldown elements for either sourcing or sinking current at the output 14 as determined by the data signal input to the gate.

When a low level voltage input appears at the input 15, a low voltage also appears at the base of phase splitter transistor Q1 and this transistor no longer conducts current through its collector to emitter thereby turning off transistor Q2. The output $V_{out}$ of the gate is therefore isolated from ground. Because Q1 is non-conducting, the high level voltage $V_{cc}$ appears at the base of sourcing transistor Q3 permitting the transistor Q3 to conduct to the base of Q4 which in turn becomes conducting and "sources" current from $V_{cc}$ to the output $V_{out}$. The TTL logic gate is therefore inherently inverting as a binary 0 at the input $V_{in}$ represented by voltage level $V_{oL}$ generates a binary 1 at the output represented by voltage level $V_{oH}$.

When a binary 1 appears at the input current from R8 supplies base drive to transistor Q1, Q1 becomes conducting, sinking current from the base of Q3 and therefore turning off the Darlington transistor current source represented by transistors Q3 and Q4. Current from high level voltage $V_{cc}$ is therefore no longer sourced to the output 14. At the same time, pulldown transistor Q2 becomes conducting through its collector to emitter to ground as a result of the current supplied to its base and begins to discharge whatever load may be coupled to the output 14 of the gate. One factor determining how transistor Q2 discharges the load, drawing the output $V_{out}$ to the low level voltage $V_o$, is the base current delivered to Q2. During transition from high to low level voltage at the output 14, the pulldown element 12 must sink current not only from whatever load capacitance may be coupled at the output but also from resistive loads of the other logic devices it is connected to. Since the emitter current of phase splitter transistor Q1 determines the base current of pulldown element transistor Q2, the collector resistor $R_c$, of the phase splitter Q1 is selected to the relatively small to permit a large current to drive pulldown transistor Q2 to greater conduction.

As shown in FIG. 1, some of the transistor and diode components are typically Schottky diodes and transistors indicated by the opposite square hooks in the schematic symbols. The Schottky clamping effected by an internal modification in these devices produces quicker turn-off during switching. A transistor logic output gate of the type illustrated in FIG. 1 while affording acceptable speed in switching and current sinking capability by selection of a low collector resistance $R_c$, suffers the disadvantage of high power consumption in the high impedance third state as will become apparent.

The element added to the output gate of FIG. 1 to create the high impedance third state at $V_{out}$ and generally provide a tristate output device instead of a bistate output device is the enable gate 18 represented in part by transistor Q6 which, when conducting, provides a route to ground from the base of pullup transistor 11 for high level voltage source $V_{cc}$ through one way diode D3. The base of phase splitter transistor Q1 and therefore any data input signal also finds a path to ground through the collector to emitter of enable gate transistor Q6 and one way diode D4. Ordinarily transistor Q6 is non-conducting so that the aforesaid routes to ground are blocked. In this condition, the output gate functions as a bistate output device in the manner already described, sinking or sourcing current at the output 14 according to whether the pulldown or pullup element is conducting.

In order to establish a high impedance third state at $V_{out}$, the enable gate 18 is activated by a signal at the base of transistor Q6 so that it becomes conducting through its collector to emitter to ground. In this state, the enable gate effectively sinks all current to the elements of the output gate including the pullup, and phase splitter stages (and therefore indirectly the pulldown element) by providing a direct route to ground through $R_c$ for the high level voltage $V_{cc}$. With all of the elements deprived of base current, the output effectively becomes a high impedance to any exterior circuitry. In this condition, the tristate output device will neither source nor sink current at the output 14 and will behave effectively as if nothing were there. Such a tristate device is therefore particularly applicable and suitable for applications in which a plurality of output gates are tied together or coupled to a common bus structure. In such common bus applications only one output, that is only one of the gates coupled to the bus structure determines the voltage (high or low) of the bus while the other outputs for the remaining gates are in the high impedance third state.

As further illustrated, the conventional enable gate 18 incorporated into the TTL output device of FIG. 1 is itself a bistate TTL gate where transistor Q6 forms the pulldown element 20 coupled with squaring circuit 21 at its base. The other elements include the Darlington transistor pullup element 22, phase splitter 23 and enable control signal input 24.

The power consumption characteristics of the output gate as illustrated in FIG. 1 are, however, sacrificed by adding the enable gate to achieve the tristate TTL output illustrated in FIG. 1. To explain this compromise more fully, reference is made to collector resistance $R_c$ of phase splitter transistor Q1 whose resistance must be low enough to assure that the Q1 emitter current to the base of Q2 is large enough to allow Q2 to sink the required load current. The problem arises in attempting to combine both the enable gate 18 which makes possible the high impedance third state and the low resistance $R_c$ which determines the current through the phase splitter 13 to the base of the pulldown transistor Q2. When the enable gate is activated and transistor Q6 conducting to ground, resistance $R_c$ affords a relatively low impedance route directly from the high level voltage source $V_{cc}$ through the enable gate to ground. The high impedance third state is therefore the condition for maximum power dissipation in phase splitter collector resistor $R_c$. In this condition the device is in the high impedance state performing no logical operation and consuming maximum power.

The foregoing account represents the closest prior art and state of the art pertinent to the present invention known to the inventor. In terms of published documentation, a recent representative presentation exemplifying this prior art and state of the art in DTL and TTL bistate and tristate output technology is found in *MILITARY SPECIFICATION MICROCIRCUITS, DIGITAL, LOW POWER SCHOTTKY, TTL, DATA SELECTORS/MULTIPLEXERS, MONOLITHIC SILICON* MIL-M-38510/309A (USAF), Jan. 4, 1978, superceding MIL-M-38510/309 (USAF), Feb. 28, 1977, Rome Air Development Center, Department of the Air Force, (RADC) (RBRD), Griffiss AFB, N.Y. 13341. Particularly pertinent to tristate output devices in this milspec are examples of commercial type microcircuits under designation numbers 54LS251 through 54LS258 corresponding to device types 05 through 08 and generally 54LS microcircuits illustrated at pages 44 through 71. Additional documentation of the prior art and state of the art known to the inventor and here presented can be found in current catalogs and data books of the commercial semiconductor microcircuit and integrated circuit manufacturers such as the *LOW POWER SCHOTTKY DATA BOOK* of the Fairchild Camera and Instrument Corporation, 464 Ellis Street, Mountain View, Calif. 94942, Copyright 1977. Pertinent portions for tristate output devices include the chapter "Circuit Characteristics" pp. 2-3 through 2-7 and applications to buffers, bus drivers and tristate outputs in the 54LS and 74LS series of 200 and greater beginning at page 5-187.

SUMMARY OF THE INVENTION

It is therefore an object of the present invention to provide a new and improved TTL tristate output gate or buffer which combines the advantages of high current sinking capability with the advantages of low power consumption in the high impedance third state. Another object of the invention is to provide a reduced power dissipation tristate output device, buffer or gate suitable for applications in which a plurality of such output devices are coupled to a common bus and only one output drives the bus while the others remain in a high impedance third state. Thus, the invention seeks to provide tristate output devices and bus drivers which can attain a high impedance in the third state while retaining the advantages of low power consumption or dissipation in the collector resistance of the phase splitter during the high impedance third state.

In order to accomplish these results, the present invention contemplates an improvement of the transistor logic tristate output device of the type comprising an input for binary data signals of high and low potential and an output, pullup means for sourcing current from high level potential to the output and output load, pulldown means for sinking current from the output and output load to low level potential, phase splitter means coupled to the input for controlling the pullup and pulldown means, and enable gate for sinking current to ground potential from the elements of the device to afford a high impedance third state at the output when the enable gate is activated. In particular, the invention contemplates integrating into such circuit a phase splitter element comprising dual transistor means coupled in a parallel configuration with parallel collector resistances providing in combination sufficient current to drive the pulldown element during transition from high to low level at the output and maintain low level output; and with only one relatively high collector resistance providing a path from high level potential to ground to restrict current and dissipation of power when the enable gate is conducting in the high impedance third state.

A feature and advantage of the arrangement contemplated by the present invention is that during transition at the output from a high to low level voltage or potential state representing a positive logic transition from binary 1 to binary 0, a sufficient current is admitted and summed through all the collector resistance paths of the plural phase splitter transistor means to the base of the pulldown element to drive conduction from the output. Yet, the arrangement of the invention restricts the route from high level voltage source to ground at the enable gate to a single phase splitter collector resistance path when the output is in the high impedance third state. Thus, power consumption or dissipation in the collector resistors is limited to the restricted current in a relatively high collector resistance path of only one of the plural transistors of the dual phase splitter element.

More particularly and in the preferred embodiment, the invention contemplates a transistor logic tristate output device comprising an input for receiving binary data signals in the form of high and low potential states; an output for delivering high and low potential states to a load and for offering a high impedance third state; a pullup element comprising transistor means for sourcing current from high potential to the output when the pullup transistor means is conducting; a pulldown element comprising transistor means for sinking current from the output to low potential when the pulldown transistor means is conducting; first phase splitter transistor means coupled between the data signal input on the one hand and the pulldown element on the other hand for controlling the conducting state of the pulldown element to sink current at the output in accordance with binary data signals at the input; second phase splitter transistor means coupled in a substantially parallel configuration with the first phase splitter transistor means between the input on the one hand and jointly coupled to drive the pulldown element on the other hand, said first and second phase splitter transistors jointly defining in parallel sum a relatively low collector resistance path, said second phase splitter means alone coupled to control the pullup element. To attain the high impedance third state the invention provides enable gate means for sinking current from the pullup and phase splitter elements of the device so that they are all non-conducting when the enable gate means is activated to prevent either sinking or sourcing of current at the output by the pullup and pulldown elements thereby affording a high impedance third state at the output when the enable gate is actuated. According to the invention the foregoing coupling arrangements permit a relatively low resistance path for sufficient current to switch from the high to low state while preventing a route from high potential to ground through the low collector resistance path while the enable gate is conducting and the device is in the high impedance third state. Power consumption in the high impedance state is thereby reduced and restricted to the small current passing through the relatively high collector resistance path defined by only one of the collector resistors of the dual phase splitter element.

In summary, the present invention contemplates for TTL tri-state output devices the improvement comprising dual phase splitter transistor means, jointly defining in parallel a relatively low collector resistance path from high potential for current to drive the pulldown element in the low level voltage output state, while restricting current and power dissipation from high level voltage to ground through a single relatively high collector resistance path when the enable gate is conducting during the high impedance third state.

From a more general perspective, the present invention contemplates a TTL tristate output device with improved circuit coupling versatility and improved component versatility in which the phase splitter element comprises plural phase splitter transistor means coupled in a parallel configuration. According to the invention, the plural phase splitter transistor means are each controlled by the input signal and are jointly coupled to control the pulldown element. However, only one of the plural phase splitter transistor means is coupled to control the pullup element and therefore only one is coupled to the enable gate through its collector circuit, whereby components may be coupled to the other of said plural transistor means to increase the versatility and capability of the device without affording a route to ground from said components through the enable gate when the enable gate is conducting and the device is in the high impedance third state.

Thus, according to the invention broadly conceived, a plurality of phase splitter transistors coupled substantially in a parallel configuration between the input and pulldown elements can afford a variety of different collector circuit paths for different components and different circuit purposes with only one of these collector circuits coupled to the pullup element and enable gate. Thus components can be coupled to the remaining plural phase splitter collector circuits and different functions can be performed by the remaining phase splitter collector circuits without seeing a route to ground through the enable gate and without being "sunk" when the enable gate is conducting in the high impedance third state.

For example, in accordance with the species embodiment described in the present application, a second phase splitter transistor coupled substantially in parallel with the first, permits addition of components to the tristate output device to afford acceptable switching speed and sufficient current for low level output while at the same time reducing power dissipation in the high impedance third state. By way of another example, in co-pending patent application Ser. No. 5928 filed Jan. 24, 1979 entitled "Transistor Logic Tristate Output With Feedback" by Paul J. Griffith, assigned to the assignee of the present application, dual phase splitter transistors coupled substantially in parallel configuration permit addition of components to afford both tristate output and feedback for high speed switching. Both cases represent species of the generic concept that multiple phase splitter transistors be coupled in parallel between the input and pulldown element, jointly to drive the pulldown element, but only one being coupled to the pullup element and consequently the enable gate. Components may therefore be added and functions performed through certain of the phase splitter collector circuits without seeing a route to ground through the enable gate when the enable gate is conducting in the high impedance third state.

Other objects features and advantages of the present invention will become apparent in the following specification and accompanying drawings.

DESCRIPTION OF THE PREFERRED EMBODIMENT

Figure 2:
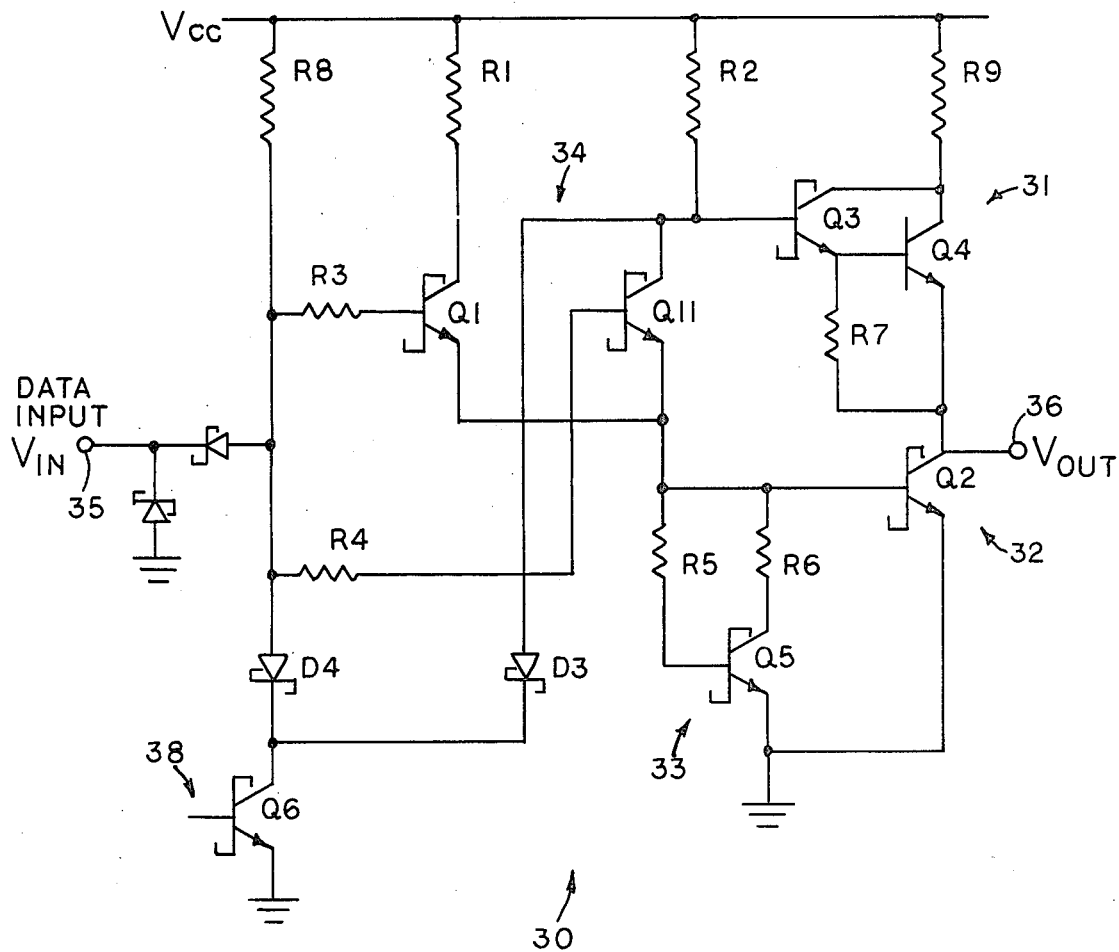
FIG. 2 is a schematic circuit diagram of a TTL tristate output device combining the features of a high impedance third state with reduced power consumption in accordance with the present invention.

In the preferred embodiment of the present invention illustrated in FIG. 2, there is provided a TTL tristate output device 30 including a Darlington transistor pullup element 31 consisting of transistors Q3 and Q4, and pulldown element 32 consisting of transistor Q2 with a conventional squaring network 33 consisting of transistor Q5 at the base of Q2. The pullup and pulldown elements function in the manner heretofore described for sourcing current from the high voltage supply $V_{cc}$ to the output $V_{out}$ or sinking current from the output to ground. The transistor and diode components of the TTL tristate output device 30 that function in the manner previously described with reference to the state of the art TTL output devices appear with corresponding designations. Thus, in addition to the pullup and pulldown elements there is also a phase splitter element 34.

In accordance with the invention, however, a dual phase splitter element is provided consisting of transistors Q1 and Q11 each of which receives the data input signal at its base. The phase splitter transistors Q1 and Q11 are coupled into the circuit in a base-emitter parallel configuration but only Q11 is coupled through its collector to the pullup element 31. In response to a high level voltage binary 1 at the input 35, the phase splitter transistors become conducting and Q11 diverts current from the bases of and turns off the pullup transistors Q3 and Q4. While phase splitter transistor Q11 alone controls the pullup element 31, transistors Q1 and Q11 jointly turn on conduction of the pulldown transistor Q2. Thus, the base of transistor Q2 is driven by the sum of emitter currents (less current into squaring network 33) from parallel phase splitter transistors Q1 and Q11. As the high voltage supply $V_{cc}$ is cut off from the output $V_{out}$ 36, the pulldown transistor Q2 sinks current from the output $V_{out}$ drawing it down to low level potential $V_{oL}$ corresponding to binary 0 at the output. Just the reverse occurs when a low level voltage or binary 0 appears at the input 35. Phase splitter transistors Q1 and Q11 turn off, turning off the pulldown transistor Q2. With Q11 nonconducting, the high level source $V_{cc}$ provides current to the base of Q3 permitting pullup transistors Q3 and Q4 to conduct, sourcing current to produce a high level voltage $V_{oH}$ corresponding to binary 1 to the output $V_{out}$.

There is also provided an enable gate 38 including transistor Q6 which functions in the manner heretofore described to divert current from the bases of the elements of the output gate when a signal at the enable gate transistor causes it to conduct. When the enable gate is conducting, the high impedance third state of the tristate output device appears at the output 36, because the device is able neither to source current to the output from voltage supply $V_{cc}$ through transistor Q4 nor sink current from the output to ground through transistor Q2. When the enable gate is non-conducting, the device continues to operate effectively as a bistate device alternating levels between high and low level according to whether the device is sinking or sourcing current at the output. Diodes D3 and D4 coupled between the devices and the collector circuit of the enable gate pulldown transistor Q6 isolate the collector and base of the phase splitter.

In accordance with the invention, additional components are integrated into the TTL tristate output device using the dual phase splitter transistors in order to combine the features of a high impedance third state with low power consumption. While the emitters of Q1 and Q11 are coupled directly to the base of pulldown transistor Q2 for jointly controlling the pulldown element, versatility is achieved through the respective collector couplings.

The collector of Q11 is coupled through resistance R2 to high level voltage supply $V_{cc}$. However, while the collector of phase splitter transistor Q11 is also coupled to the base of pullup transistor Q3 and therefore the enable gate 38, the collector of parallel phase splitter transistor Q1 follows a different path. The collector of Q1 is coupled through resistance R1 to high level voltage supply $V_{cc}$ without other connections. Resistors R1 and R2 are selected to provide in parallel sum a relatively low value resistance thereby admitting a collector current sum through Q1 and Q11 sufficiently large to drive Q2 to conduction sinking current at the output to ground and maintaining a low level voltage at the output. Thus, in response to a high level voltage at the input, Q1 and Q11 become conducting and the collector currents admitted by resistors R1 and R2 provide the current necessary to drive pulldown transistor Q2 at the desired level of conduction for switching the output to low level voltage at the desired speed and for maintaining the low level output as long as the high level voltage appears at the input.

A collector current is maintained in transistor Q11 through resistor R2 which couples the collector to high voltage supply $V_{cc}$. Resistor R2 is preferably selected to have a resistance in a range of R2≃R1 or R2≧R1 so that the collector current of transistor Q11 is substantially equal to or less than the collector current through transistor Q1. However, the objectives of the invention may also be achieved where R2 is less than R1 as hereinafter described and the equation R2≃R1 is intended to encompass a situation where R2 may be slightly less than R1. Thus, while transistor Q11 alone controls the pullup element 31, it contributes jointly with transistor Q1 to the current driving the base of pulldown transistor Q2.

Figure 1:
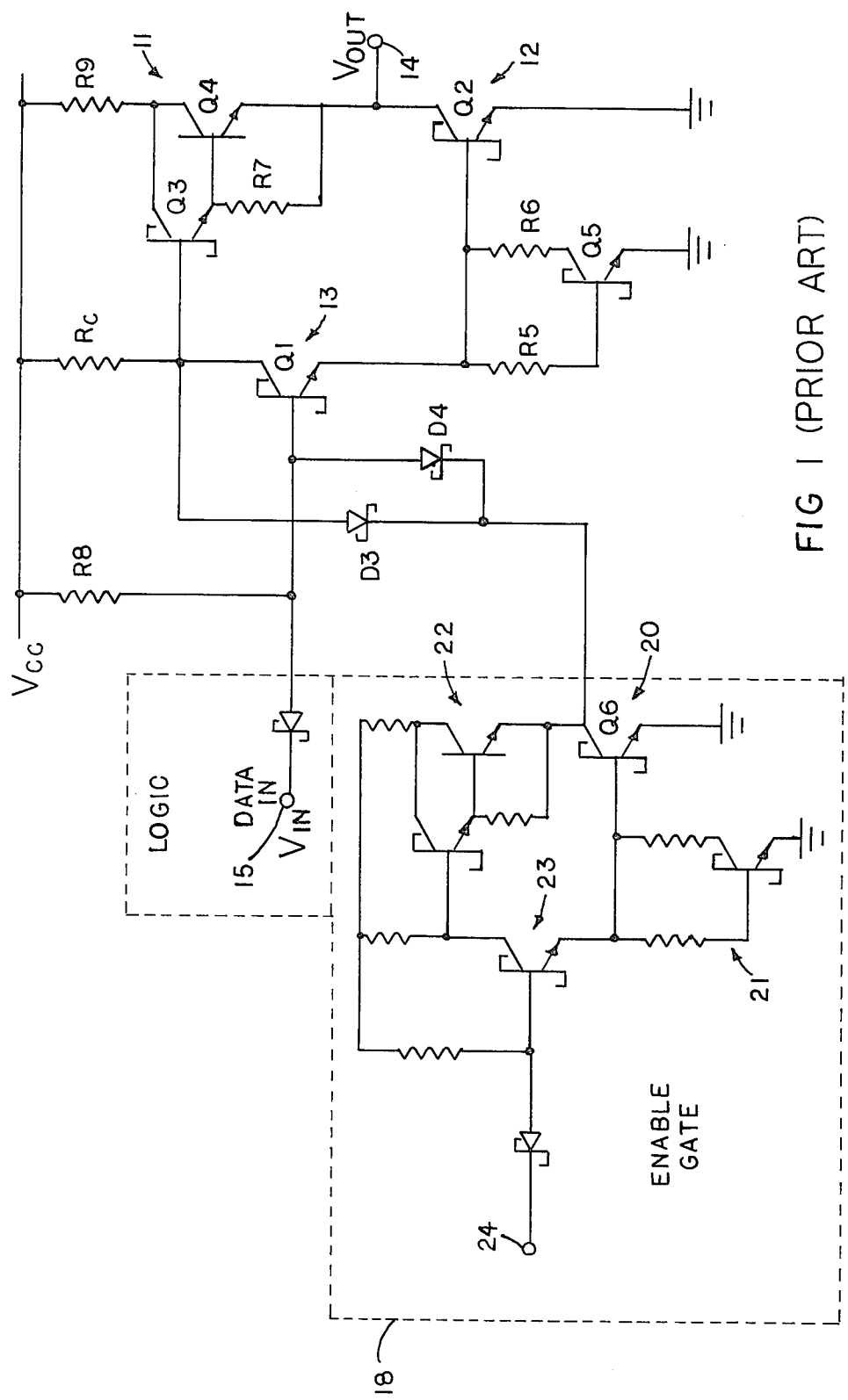
FIG. 1 is a schematic circuit diagram of a conventional prior art tristate output device and enable gate.

The respective collector resistances R1 and R2 for transistors Q1 and Q11 are selected so that the sum of the currents through them is equal to the desired collector current which otherwise passes through resistor $R_c$ in the conventional TTL output device as illustrated in FIG. 1. The parallel sum of R1 and R2 would therefore generally be equivalent to the typical resistor $R_c$. Thus, R1 and R2 are selected in the preferred range such that:

$$1/R_c = (1/R1) + (1/R2)$$

and $$R2 \simeq R1 \text{ or } R2 \geq R1$$

In the high impedance or hi-Z (high Z) state where transistor Q6 is conducting to ground, the arrangement of the present invention, illustrated in the embodiment of FIG. 2, affords a route to ground for the high level voltage supply $V_{cc}$ through only one of the phase splitter collector resistors. In this example, it is R2 and R2 may be selected to be at relatively high resistance. The power dissipation from the collector resistors of the phase splitter in the hi-Z state is restricted by relatively high level resistor R2 while no dissipation current passes through R1. It should be recalled that the collector of phase splitter transistor Q1 is not coupled to the base of the pullup element and therefore not coupled to the enable gate. Power dissipation in the conventional device of FIG. 1 in the hi-Z state is a function of $R_c$. According to the embodiment of the present invention illustrated in FIG. 2, it is a function of R2 the collector resistance of only one of the dual phase splitters, and the power dissipated in the phase splitter element of the present invention is reduced by a factor of $R_c/R2$, the ratio of $R_c$ to R2.

In some situations, it is desirable to add a small resistor to the base of each of the phase splitter transistors to balance the base drive according to the different collector currents. These resistances are indicated as resistors R3 and R4 for transistors Q1 and Q11 respectively and insure that both Q1 and Q11 will saturate when conducting current from R1 and R2. Darlington transistor discharge resistor R7 may be connected to ground instead of the output so that in the tristate (high impedance) mode the output leakage at $V_{out}$ is reduced. By way of a specific example of the preferred embodiment, exemplary values for each of the resistances of the circuit of FIG. 2 are provided in Table 1.

TABLE 1

| R | OHMS |
|---|---|
| R1 | 4000 |
| R2 | 6000 |
| R3 | $\sim \phi$ |
| R4 | $\sim \phi$ |
| R5 | 2000 |

TABLE 1-continued

| R | OHMS |
|---|---|
| R6 | 1500 |
| R7 | 10,000 |
| R8 | 10,000 |
| R9 | 45 |

By providing separate collector resistance paths through resistors R1 and R2 to dual phase splitter transistors Q1 and Q11, the phase splitter resistance $R_c$ of the conventional tristate output device has been effectively split into separate parallel resistances, each of which is greater than $R_c$. Only one of these resistances provides a path from high potential to ground in the hi-Z state when the enable gate is conducting. Thus, whatever the values of R1 and R2 the resistance path from $V_{cc}$ to ground through the enable gate will offer higher resistance than the conventional $R_c$ provided:

$$1/R_c = (1/R1) + (1/R2)$$

In selecting values for R1 and R2, the objectives of the invention are to some extent achieved even if R2 is less than R1, for the collector resistance $R_c$ has still been split into two parallel resistances each of which is greater than the original $R_c$. The preferred range, however, for the parallel phase splitter collector resistances would be in the range of R2 greater than or equal to R1 up to a ratio of R2 being three to four times greater than R1, the upper limit of which is determined by the current driving requirements at the base of transistor Q3 of pullup element 31.

These general principles for the selection of values of dual phase splitter resistances would also apply in the case of multiple parallel phase splitter resistances beyond two with the parallel sum of the resistances R1, R2 . . . RN providing the total phase splitter collector resistance $R_c$.

Transistors are of the NPN type either regular or Schottky-clamped as required in TTL logic with diodes of the PN type either regular or Schottky-clamped. All may be fabricated according to the well-known and well-documented procedures of solid state integrated circuit technology. Typical circuit characteristics and design considerations for these components are found, for example, in the Fairchild *Low Power Schottky Data Book* referred to above.

I claim:

1. In a transistor logic tristate output device of the type comprising an input and an output for binary data signals of high and low level potential, pullup element for sourcing current to the output from high potential, pulldown element for sinking current from the output to low potential, phase splitter element coupled at the input to control the pullup and pulldown elements, and an enable gate for sinking current from the elements of the device to afford a high impedance third state at the output when the enable gate is activated, the improvement comprising:
   means defining a relatively high resistance path from high potential through the enable gate to low potential when the enable gate is activated thereby restricting power consumption in the high impedance third state;
   said means defining a relatively low resistance path from high potential for current controlling the pulldown element without providing a route to low potential through said low resistance path when the enable gate is activated.

2. In a transistor logic tristate output device of the type comprising an input and an output for binary data signals of high and low level potential, pullup element for sourcing current to the output from high potential, pulldown element for sinking current from the output to low potential, phase splitter element coupled at the input to control the pullup and pulldown elements, and an enable gate for sinking current from the elements of the device to afford a high impedance third state at the output when the enable gate is activated, the improvement comprising:
   said phase splitter element comprising plural phase splitter transistor means, said plural phase splitter transistor means coupled to define in parallel sum a relatively low collector resistance path from high potential for current to drive the pulldown element, one of said phase splitter means coupled to define a relatively high collector resistance path restricting current and power dissipation from high potential to ground when the enable gate is conducting during the high impedance third state.

3. In a transistor logic tristate output device of the type comprising an input and an output for binary data signals of high and low potential, pullup element for sourcing current to the output from high potential, pulldown element for sinking current from the output to low potential, phase splitter element coupled at the input to control the pullup and pulldown elements, and an enable gate for sinking current from the elements of the device to afford a high impedance third state at the output when the enable gate is activated, the improvement comprising:
   said phase splitter element comprising dual phase splitter means comprising first and second transistor means in substantially parallel configuration; said first and second transistor means jointly coupled to the pulldown element to control sinking of current from output to low potential according to the sum of currents through said dual transistor means; said first and second transistor means provided with separate means for coupling to high potential through resistances R1 and R2 respectively; said second transistor means separately coupled to the pullup element and enable gate to control sourcing of current from high potential to output; whereby sinking of current from output to ground in the low output state by the pulldown element is controlled by the sum of currents passing through resistors R1 and R2 while the sinking of current from the elements of the device through the enable gate in the high impedance third state is accompanied by a lesser current through resistance R2 alone.

4. A transistor logic tristate output device as set forth in claim 3 wherein the resistance values of R2 and R1 are selected so that R2≃R1 or R2≧R1.

5. A transistor logic tristate output device as set forth in claim 4 wherein the first and second phase splitter transistor means are separately coupled to the input through resistors R3 and R4 to insure that both phase splitter transistor means saturate when conducting current from R1 and R2.

6. A transistor logic tristate output device comprising:
   an input for receiving binary data signals in the form of high and low potential states;

a pullup element comprising transistor means for sourcing current from a high potential when the transistor means is conducting;

a pulldown element comprising transistor means for sinking current to a low potential when said transistor means is conducting;

an output coupled between the pullup and pulldown elements for delivering either high or low potential to a load according to whether the pullup or pulldown element is conducting;

first phase splitter element transistor means coupled between the data signal input on the one hand and the pulldown element on the other hand for controlling the conducting state of said pulldown element;

second phase splitter element transistor means coupled substantially in parallel with said first phase splitter element transistor means between the input on the one hand and pulldown element on the other hand for jointly controlling said pulldown element but also coupled to the pullup element for alone controlling the conducting state of said pullup element;

said first and second phase splitter element transistor means, provided with separate coupling means for parallel coupling to high potential through collector resistances R1 and R2 respectively;

enable gate means for sinking current from the pullup and phase splitter elements of the device so that they are all non-conducting when the enable gate means is activated thereby to prevent either sinking or sourcing of current at the output by the pullup and pulldown elements whereby a high impedance third state is afforded at the output when the enable gate is activated;

whereby sinking of current from output to ground in the low output state by the pulldown element is controlled by the sum of currents passing through collector resistors R1 and R2 while the sinking of current from the elements of the device through the enable gate in the high impedance third state is accompanied by a lesser current through resistor R2 alone.

7. A transistor logic tristate output device as set forth in claim 6 wherein the resistance values of R1 and R2 are selected in the range:

$R2 \geq R1$ $R2 < 4R1.$

8. A transistor logic tristate output device as set forth in claim 7 wherein the first and second phase splitter transistor means are separately coupled to the input through resistors R3 and R4.

9. A transistor logic tristate output device comprising:

an input for receiving binary data signals in the form of high and low potential states;

an output for delivering high and low potential states to a load and for offering a high impedance third state;

a pullup element comprising transistor means for sourcing current from a high potential state to the output when the transistor means is conducting, the collector means of the pullup element coupled to a high potential source and the emitter means coupled to the output;

a pulldown element comprising transistor means for sinking current from the output to a low potential source when said transistor means is conducting, the collector means of the pulldown element coupled to the output and the emitter means coupled to the low potential source;

a dual phase splitter element coupled between the data signal input on the one hand and the pullup and pulldown elements on the other hand for alternately controlling the conducting state or phase of the pullup and pulldown elements to alternately source or sink current at the output in accordance with binary data signals at the input, said dual phase splitter element comprising first and second transistor means in substantially parallel configuration, the emitter means of both said first and second transistors jointly coupled to the base of the pulldown element transistor means, said dual phase splitter element first and second transistor means provided with separate collector coupling means for coupling to high potential through resistances R1 and R2 respectively where $R2 \geq R1$, the collector means of only said second transistor means also separately coupled to the base means of the pullup element transistor means to control sourcing of current from high potential to output, the base means of said phase splitter element first and second transistor means separately coupled to the input through resistors R3 and R4 respectively;

enable gate means comprising transistor means for sinking current from the elements of the device so that they are all non-conducting when the enable gate means is activated, thereby to prevent either sinking or sourcing of current at the output by the pullup and pulldown elements whereby a high impedance third state is afforded at the output when the enable gate is activated, the collector means of said enable gate transistor sinking means coupled through one way diode means to the base means of both the dual phase splitter element transistor means, whereby sinking of current from output to ground in the low output state by the pulldown element is controlled by the sum of currents passing through the lesser resistance of the parallel sum of collector resistors R1 and R2 and through the first and second phase splitter transistor means respectively sufficient to drive the pulldown element to a desired level of conduction, while the sinking of current from the elements of the device through the enable gate in the high impedance third state is accompanied by a lesser current from high potential through the greater resistance of R2 alone.

10. In a transistor logic tristate output device of the type comprising an input and an output for binary data signals of high and low potential, pullup element for sourcing current to the output from high potential, pulldown element for sinking current from the output to low potential, phase splitter element coupled at the input to control the pullup and pulldown elements, and an enable gate for sinking current from the pullup and phase splitter elements of the device to afford a high impedance third state at the output when the enable gate is activated, the improvement comprising:

said phase splitter element comprising a plurality of transistor means coupled in substantially parallel configuration, said plural phase splitter transistor means jointly coupled to the pulldown element to control sinking of current from output to ground according to the sum of currents through said plural transistor means, each said plural transistor means also coupled to the input, and only one of said plural phase splitter transistor means coupled to the pullup element to control sourcing of current from high potential to output, whereby components may be coupled through the other of said plural phase splitter transistor means without affording a route to ground through the enable gate when the enable gate is activated and the device is in the high impedance third state.

11. A transistor logic tristate output device comprising:

an input for receiving binary data signals comprising high and low potential states;

an output for delivering high and low potential states and for offering a high impedance third state;

a pullup element comprising transistor means for sourcing current from a higher potential state to the output when the transistor means is conducting;

a pulldown element comprising transistor means for sinking current from the output to a lower potential state when said transistor means is conducting;

said output coupled between the pullup and pulldown elements for delivering either the higher or lower potential to a load according to whether the pullup or pulldown element is conducting;

first phase splitter element transistor means coupled between the data signal input on the one hand and the pulldown element on the other hand for controlling the conducting state or phase of the pulldown element to sink current at the output in accordance with binary data signals at the input;

second phase splitter element transistor means coupled substantially in parallel with said first phase splitter transistor means between the input on the one hand and the pulldown element on the other hand jointly to control the pulldown element, said second phase splitter also coupled to the pullup element for separately controlling the conducting state of said pullup element for sourcing current at the output in accordance with binary data signals at the input;

enable gate means for sinking current from the pullup and phase splitter elements of the device so that they are all non-conducting when the enable gate means is activated to prevent either sinking or sourcing of current at the output by the pullup and pulldown elements and to afford a high impedance third state at the output when the enable gate is activated;

whereby components may be coupled through the first phase splitter element transistor means without affording a route to ground through the enable gate when the enable gate is activated and the device is in the high impedance third state.

12. In a transistor logic tristate output device of the type comprising an input for receiving binary data signals in the form of high and low potential states, a pullup element comprising transistor means for sourcing current from a high potential when the transistor means is conducting, a pulldown element comprising transistor means for sinking current to a low potential when said transistor means is conducting, phase splitter element comprising transistor means coupled between the data signal input on the one hand and the pullup and pulldown elements on the other hand for alternately controlling the conducting state of said pullup and pulldown elements for either sourcing or sinking current in accordance with binary data signals at the input, an output coupled between the pullup and pulldown elements for delivering either high or low potential to a load according to whether the pullup or pulldown element is conducting, enable gate means for sinking current from the elements of the device so that they are all non-conducting when the enable gate means is activated thereby to prevent either sinking or sourcing of current at the output by the pullup and pulldown elements whereby a high impedance third state is afforded at the output when the enable gate is activated, the improvement comprising:

said phase splitter element comprising dual phase splitter means in turn comprised of first and second parallel transistor means jointly coupled to the pulldown element jointly to control the sinking of current from the output to low potential, said second phase splitter transistor means separately coupled to the pullup element and enable gate to control sourcing of current from high potential to output.

* * * * *